US 8,796,816 B2

(12) United States Patent
Hayashi et al.

(10) Patent No.: US 8,796,816 B2
(45) Date of Patent: Aug. 5, 2014

(54) SEMICONDUCTOR MODULE WITH ELECTRICAL SWITCHING ELEMENTS

(75) Inventors: Yuji Hayashi, Kasugai (JP); Yuuichi Handa, Anjo (JP)

(73) Assignee: Denso Corporation, Kariya (JP)

( * ) Notice: Subject to any disclaimer, the term of this patent is extended or adjusted under 35 U.S.C. 154(b) by 705 days.

(21) Appl. No.: 13/086,620

(22) Filed: Apr. 14, 2011

(65) Prior Publication Data

US 2011/0291236 A1  Dec. 1, 2011

(30) Foreign Application Priority Data

Apr. 14, 2010 (JP) ................. 2010-092744
Apr. 8, 2011 (JP) ................. 2011-085974

(51) Int. Cl.
*H01L 29/02* (2006.01)

(52) U.S. Cl.
USPC ............. 257/532; 257/676; 257/E23.031; 257/E29.002; 257/81; 257/82; 257/502; 257/734

(58) Field of Classification Search
CPC .................... H01L 29/02; H01L 23/495
USPC ........... 257/532, 676, E23.031, E29.002, 81, 257/82, 502, 734
See application file for complete search history.

(56) References Cited

U.S. PATENT DOCUMENTS

| 6,115,270 | A | 9/2000 | Yamane et al. | |
| 6,184,585 | B1 * | 2/2001 | Martinez et al. | 257/777 |
| 6,291,880 | B1 * | 9/2001 | Ogawa et al. | 257/723 |
| 2001/0048148 | A1 | 12/2001 | Koyama et al. | |
| 2003/0006434 | A1 | 1/2003 | Kawafuji et al. | |

FOREIGN PATENT DOCUMENTS

| JP | H02-188946 | 7/1990 |
| JP | H03-057259 | 3/1991 |
| JP | H06-085147 | 3/1994 |
| JP | 2000-333476 | 11/2000 |
| JP | P2001-332687 A | 11/2001 |
| JP | P2003-018862 A | 1/2003 |
| JP | 2008-136333 | 6/2008 |

OTHER PUBLICATIONS

Japanese Office Action dated Jun. 5, 2012, issued in corresponding Japanese Application No. 2011-085974 with English translation.

* cited by examiner

*Primary Examiner* — Marc Armand
(74) *Attorney, Agent, or Firm* — Nixon & Vanderhye PC

(57) ABSTRACT

A semiconductor module is provided which is capable of lowering surges caused when switching elements are switched on and off. The module has a plurality of lead frames, switching elements, electronic components, and a sealing member. The switching elements are electrically connected to the lead frames respectively. Part of the lead frames, the switching elements, and the electronic components are sealed by the sealing member. The electronic components are mounted on primary surfaces of the lead frames respectively.

15 Claims, 15 Drawing Sheets

SEMICONDUCTOR MODULE WITH ELECTRICAL SWITCHING ELEMENTS

CROSS REFERENCE TO RELATED APPLICATIONS

This application is based on and claims the benefit of priority from earlier Japanese Patent Application Nos. 2010-92744 filed Apr. 14, 2010 and 2011-85974 filed Apr. 8, 2011, the description of which is incorporated herein by reference.

BACKGROUND OF THE INVENTION 1. (Technical Field)

The present invention relates to a semiconductor module provided with electronic components, and in particular, to a semiconductor module provided with switching elements which serve as electronic components.

2. (Related Art)

There have been known power conversion apparatuses mounted in vehicles. Such apparatuses include apparatuses described by Japanese Patent Laid-open Publication Nos. 2000-333476 and 2008-136333.

The power conversion apparatus described in these publications has a configuration shown in FIG. 1. Practically, as shown, a power conversion apparatus 90 has a semiconductor module 900 including switching semiconductors 82 and a smoothing capacitor 94 electrically connected to both positive and negative sides of a DC power supply. This power conversion apparatus 90 is used to, for example, convert DC power of a DC power supply 91 to AC power.

Each of the switching semiconductors 92 has a switching element 95 which is for example an IGBT and a freewheel diode 96. Each switching element 95 has a gate terminal 95g connected to a not-shown control circuit board. This control circuit board controls on/off switching operations of the switching element 95. This control makes it possible to convert, to AC voltage, DC voltage applied between the positive-electrode terminal 98 of the high-potential side switching semiconductor 92H and the negative-electrode terminal 99 of the low-potential side switching semiconductor 92L, and to output the converted AC voltage from an AC output terminal 97.

However, the foregoing conventional semiconductor module 900 generates a surge voltage when each switching element 95 is switched on/off. Hence, to resist this surge voltage, each switching element 95 should have a high withstanding voltage. This results in a rise in manufacturing cost of the power conversion apparatus 90.

Meanwhile, there is known a technique of electrically parallel connecting a snubber capacitor to the switching element. This connection absorbs a surge generated by switching the switching element. However, a conventional semiconductor module has a snubber capacitor wire-bonded, so that the wire has a large amount of parasitic inductance L. This will cause a higher surge voltage ($V=-L \cdot di/dt$). As a result, the effect given by the snubber capacitor is insufficient.

SUMMARY OF THE INVENTION

Hence, from the foregoing, it is desired to provide a semiconductor module which is able to reduce a surge caused in response to on/off switching operations of the switching element.

In order to achieve the above object, the semiconductor module according to the present disclosure has, as ones of its fundamental components, a plurality of lead frames; switching elements electrically connected to the lead frames respectively; electronic components electrically connected to the switching elements; and a sealing member that seals at least part of the lead frames, the switching elements, and the electronic components, wherein the electronic components are mounted on primary surfaces of the lead frames.

Hence, since the electronic components connected to the switching elements are mounted on the primary surfaces of the lead frames, inductance between the electronic components and connection parts of the lead frames can be lowered. If the electronic components are connected with wire bonding, the wires are apt to have parasitic inductance. However, in the present disclosure, without using wires, electronic components are directly mounted on the primary surfaces of the lead frames. Hence, the inductance can be lowered, so that surges ($V=-L \cdot di/dt$) caused in switching on and off the switching elements can also be suppressed and lowered.

It is preferred that, in the foregoing semiconductor device, the electronic components have a pair of connection terminals, and one of connection terminals composing the pair of connection terminals and a corresponding one of the switching elements are arranged on the same lead frame.

Hence, thanks to the foregoing configuration, compared with a configuration where the switching elements and the electronic components mounted on different lead frames and connected by wires or others, it is possible to reduce further the inductance between the switching element(s) and the electronic component(s). Surges caused in the operations of the switching elements can be lowered more.

It is also preferred that the electronic components have a pair of connection terminals, the electronic components are connected between the two lead frames, and the pair of connection terminals are arranged, terminal by terminal, on the primary surfaces of the lead frames, respectively, which are different from each other.

In this case, thanks to the foregoing configurations, inductance between the one lead frame and the electronic component(s) can be reduced, and the other lead frame and the electronic component(s) can be reduced. That is, inductance caused between the two lead frames can be reduced, whereby surges caused in the operations of the switching elements can be lowered more.

Preferably, the semiconductor module comprises relaying lead frames positionally separated from the lead frames, wherein the electronic components have a pair of connection terminals, one terminal of the paired connection terminals is mounted on a corresponding one of primary surfaces of the relaying lead frames, and the other connection terminal is mounted on a corresponding one of the primary surfaces of the lead frames.

In this case, the primary surfaces of the relaying lead frames and lead frames are used for arrangement of the electronic components, so that it is possible to reduce not only inductance between the relaying lead frame(s) and the electronic component(s) but also inductance between the lead frame(s) and the electronic component(s). This means that inductance caused between the lead frame(s) and the relaying lead frame(s) can be reduced, leading to lowering surges from the switching elements in a more reliable manner.

Still preferably, the electronic components composed of a plurality of electronic components are connected in series via the relaying lead frames and two lead frames of the lead frames are electrically connected by both the plurality of electronic components and the relaying lead frames, the two lead frames being positionally separated from each other.

In this serial connection of the plural electronic components, in cases where capacitors and resistors are used as the electronic components and one of those components is short-circuited, the normal operation of the module can be maintained as long as the other components are operating normally. This will raise reliability of the semiconductor module.

Additionally, the foregoing configuration allows the plural electronic components and relaying lead frames to electrically connect the two lead frames, with no use of wires and leads. Accordingly, the amount of inductance between the lead frames can be reduced, lowering surges caused in switching on and off the switching elements.

It is also preferred that the electronic components are either snubber capacitors or line bypass capacitors, the snubber capacitors being electrically connected parallely with the switching elements respectively to absorb surges caused when the switching elements are switched on and off, the line bypass capacitors being electrically connected between the switching elements and a ground terminal to absorb common mode noise caused when the switching elements are switched on and off.

When the snubber capacitors serving as the electronic components are employed, surges from the switching elements can be absorbed. This means that switching elements having lower withstanding voltages can be used, reducing the manufacturing cost of the power conversion apparatus. Mounting the snubber capacitors on the primary surfaces of the lead frames reduces the amount of impedance between the lead frame and the snubber capacitor. A reduction in this impedance makes it easier that the current flows through the snubber capacitor when the switching element is made to switch at higher rate. Hence, soft switching can be performed easily and switching loss can be reduced compared to the conventional devices.

Meanwhile, if the line bypass capacitors serving as the electronic components are employed, it is possible to reduce common mode noise leaking outside from the ground terminals via the stray capacitance of the semiconductor module. Additionally, incorporating the line bypass capacitors into the semiconductor module, the electronic circuit of this module can be made more compact, compared with not being incorporated, being improved in productivity of the semiconductor module. Still additionally, by locating the capacitors, which absorb the common mode noise, closer to the switching elements generating noise, the area of a loop through which the common mode noise flows can be reduced, leading in a reduction in emission of electromagnetic waves.

It is also preferred that each of the snubber capacitors and the line bypass capacitors is a chip capacitor having connection terminals bonded to corresponding ones of the primary surfaces of the lead frames by soldering, welding, or using conductive adhesive.

This configuration is helpful for further reducing inductance at portions connecting the snubber capacitor and the lead frame. If the snubber capacitor is realized by a capacitor having a lead wire, the lead wire may easily have a large amount of parasitic inductance L. In such a case, it is frequent that a surge ($V=-L \cdot di/dt$) becomes larger and switching loss becomes large as well. In contrast, chip capacitors soldered or bonded by other means are employed as the snubber capacitors and the line bypass capacitors, so that the snubber and line bypass capacitors can be connected to the lead frames without using lead wire. Thanks to this connection, the parasitic inductance between the capacitor(s) and the lead frame(s) is difficult to increase, leading to reduction in both surges from the switching elements and switching loss.

Further, it is preferred that, of the switching elements, mutually serially connected two switching elements and, of the snubber capacitors, two snubber capacitors connected to the two switching elements respectively are grouped as one unit of switching element groups, wherein the one unit or plural units of the switching element groups are united for being sealed by the sealing member.

Hence, compared to sealing switching elements one by one, the switching elements can be consolidated by the foregoing unified sealing manner, easily making an electronic circuit, thereby making the electronic circuit more compact and improving the productivity of the module.

Preferably, the plural units of the switching element groups are connected parallely with each other and united with each other.

This configuration results in an easier formation of electronic circuits by using the semiconductor module. For example, if two switching element groups are connected parallely with each other for unification, the semiconductor module can be used as a DC-DC converter. If there switching element groups are connected parallely to each other for unification, the semiconductor module can be used as an inverter.

Still preferably, the switching element groups include two units of the switching element groups having four switching elements included in the switching elements, the four switching elements being located at positions virtually corresponding to apexes of a quadrangle when viewed along a line normal to the primary surfaces of the lead frames.

Hence, this allows four switching elements to be located closer to each other. Inductance caused between these four switching elements can be reduced easily. Additionally, compared with arrangement of four switching elements along a linear line, the semiconductor module can be made more compact.

DETAILED DESCRIPTION OF PREFERRED EMBODIMENTS

Referring to the accompanying drawings, preferred embodiments of a semiconductor module according to the present invention will now be described.

First Embodiment

Referring to FIGS. 2 to 7, the first embodiment of the semiconductor module according to the present invention will now be described.

Figure 1:
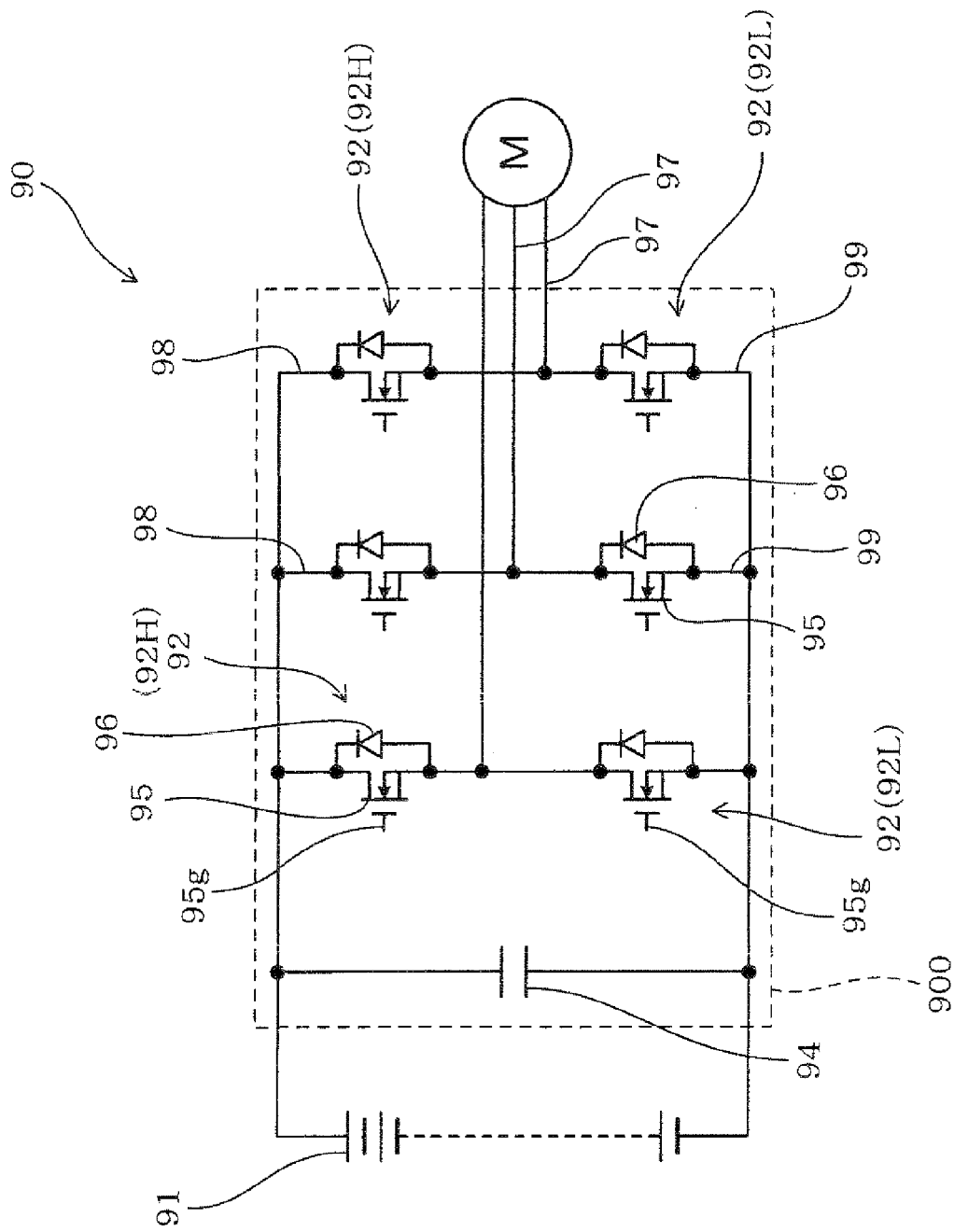
FIG. 1 is a circuit diagram showing a conventional semiconductor module.
Figure 2:
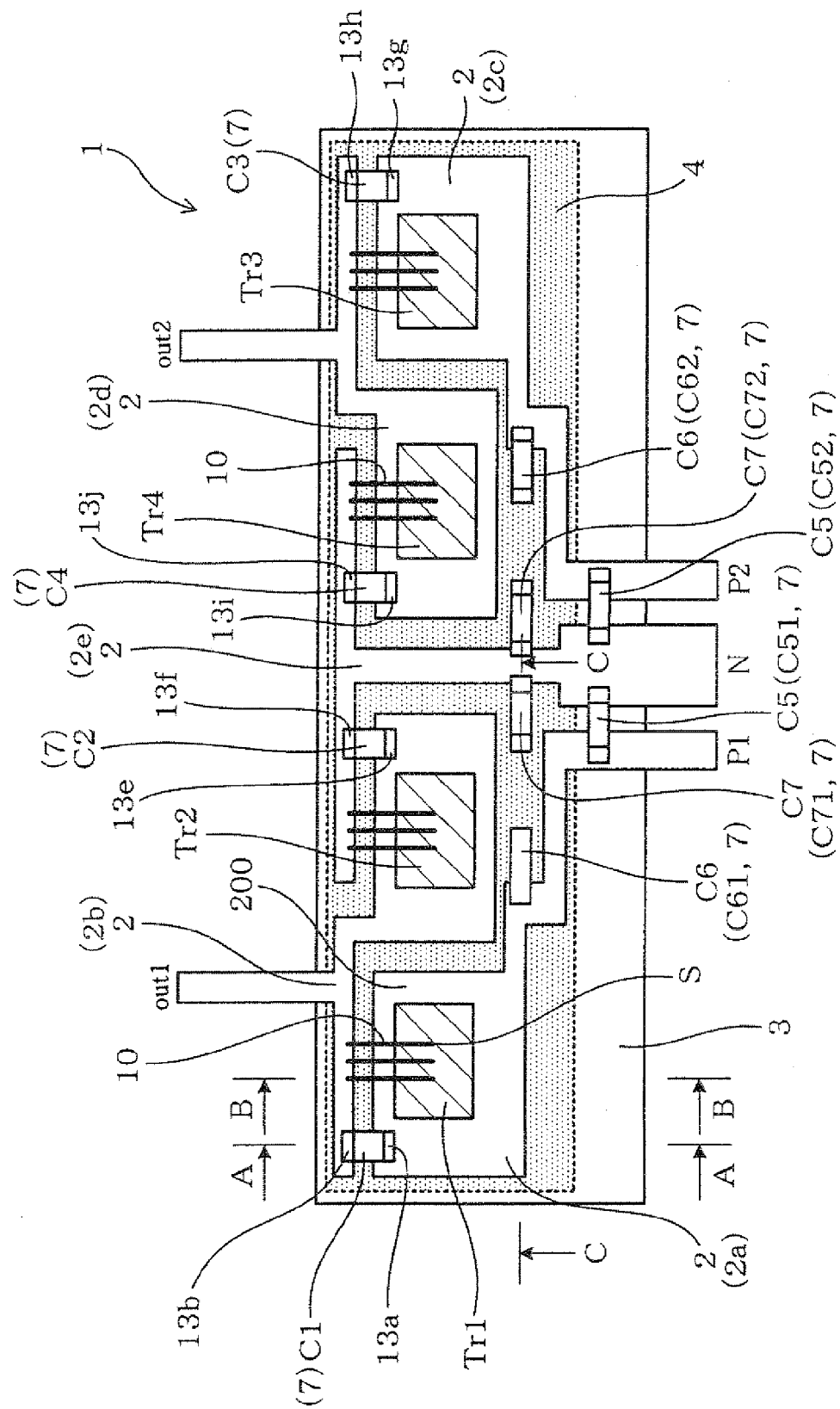
FIG. 2 is a plan view of a semiconductor module according to a first embodiment of the present invention, which view also shows a sectional view taken along a D-D line in FIG. 3.

As shown in FIG. 2, a semiconductor module 1 according to the present invention has a plurality of lead frames 2, switching elements Tr (Tr1 to Tr4), electronic components 7, and a sealing member 3.

Each of the switching elements Tr is electrically connected to a corresponding one of the lead frames 2. The electronic components 7 are electrically connected to the switching elements Tr. The sealing member 3 seals part of the lead frames 2, the switching elements Tr1 to Tr4, and the electronic components 7.

Figure 3:
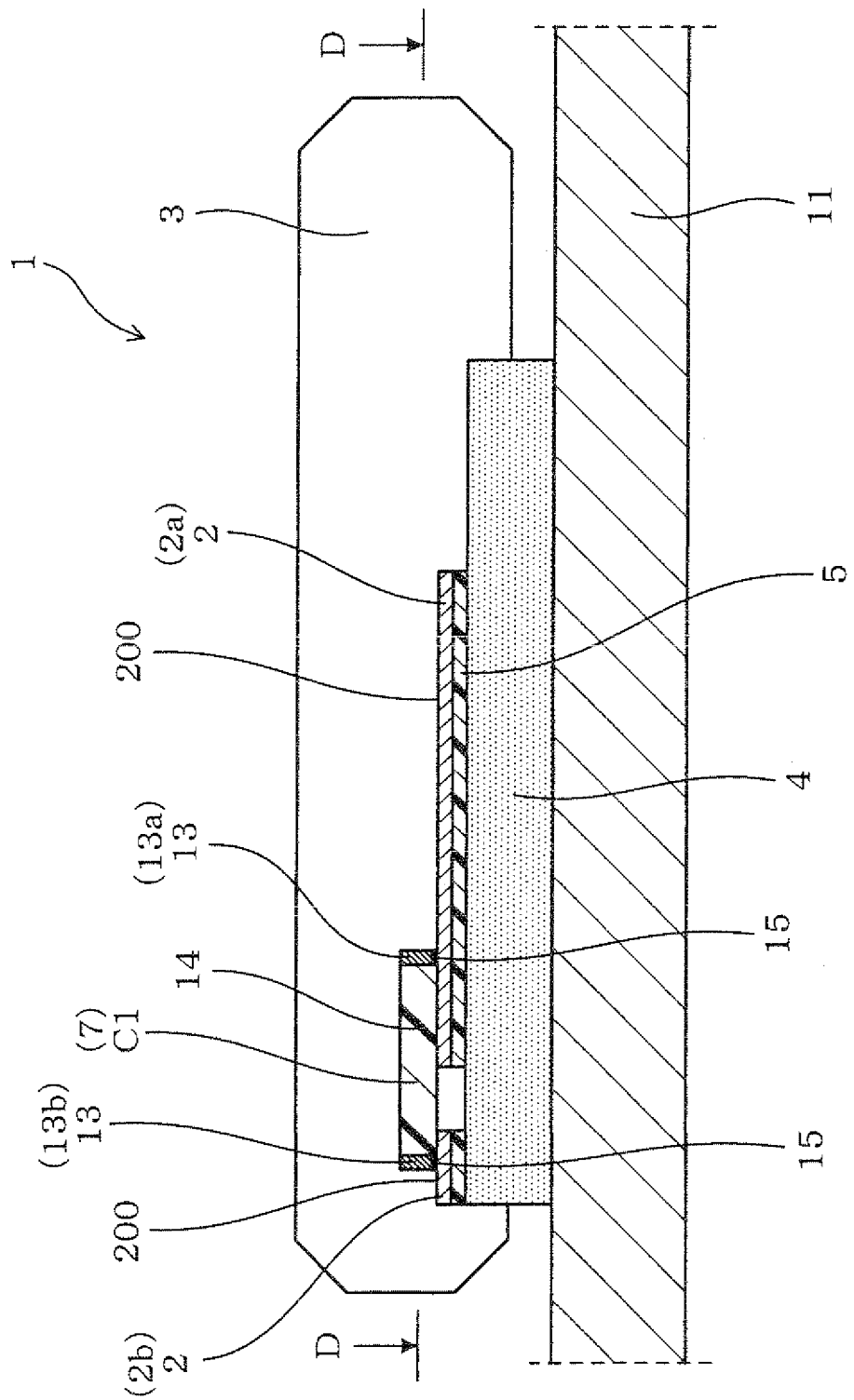
FIG. 3 is a sectional view taken along an A-A line in FIG. 2.

As shown in FIGS. 2 and 3, the electronic components are mounted on the primary surface 200 of the respective lead frames 2.

As shown in FIG. 2, the semiconductor module 1 has five lead frames 2a to 2e. To each of the first to fourth lead frames 2a to 2d, a single switching element Tr is connected. The switching elements Tr1 to Tr4 are N-channel MOS-FETs (refer to FIGS. 6 and 7).

The switching elements Tr1 to Tr4 have surfaces 70 (refer to FIG. 4) on each of which a drain electrode D is formed and the primary surface 200 of the lead frame 2 is soldered. In addition, the switching elements Tr1 to Tr4 have source electrodes S, which are boded to another lead frame 2 by a wire 10.

In the present embodiment, the mounted electronic components are snubber capacitors C1 to C5 and line bypass capacitors C6 and C7. The snubber capacitors are connected parallel with the switching elements Tr, respectively (refer to FIG. 6), to absorb a surge generated when each switching element Tr is switched. The line bypass capacitors C6 and C7 are connected between the switching elements Tr and ground terminals 4, respectively (refer to FIG. 6), thereby absorbing common mode noise generated when the switching elements Tr are switched.

As shown in FIG. 3, in the present embodiment, the first snubber capacitor C1 (electronic components) is connected between the two lead frames 2a and 2b. The snubber capacitor C1 is a chip capacitor. This chip capacitor has a cuboid-shaped body 14 and a pair of connection terminals 13a and 13b arranged on a side of the body 14. Of this paired connection terminals 13a and 13b, one connection terminal 13a is electrically connected to and on the first lead frame 2a, while the other connection terminal 13b is electrically connected to and on the second lead frame 2b. In the present embodiment, the connection terminals 13 and the lead frames 2 are connected by soldering portions 15, respectively, but both components may be welded together or bonded with electrically-conductive adhesive for electrical conduction therebetween.

The other snubber capacitors C2 to C4 have the identical configuration to the first snubber capacitor C1 described above.

Further, as shown in FIG. 2, both the one connection terminal 13a of the first snubber capacitor C1 (serving as one of the electronic components) and the first switching element Tr1 are arranged on the same lead frame 2a. This arrangement is also true of the other snubber capacitors C2 to C4. Practically, both the one connection terminal 13e of the second snubber capacitor C2 and the second switching element Tr2 are arranged on the same lead frame 2b. Both the one connection terminal 13g of the third snubber capacitor C3 and the third switching element Tr3 are arranged on the same lead frame 2c. Furthermore, both the one connection terminal 13i of the fourth snubber capacitor C4 and the fourth switching element Tr4 are arranged on the same lead frame 2d.

As shown in FIG. 3, the semiconductor module 1 in the present embodiment has the ground terminal 4. Between this ground terminal 4 and the lead frames 2, an insulating member 5 is disposed. The ground terminal 4 also serves as a radiator plate for the switching elements Tr1 to Tr4. Part of the ground terminal 4 is exposed outside from the sealing member 3. The ground terminal 4 is made to come in contact with an inner surface of a metal mounting case 11 in which the semiconductor module is mounted. This counting case 11 electrically communicates with the body of a vehicle (not shown). In this way, the metal mounting case 11 is used to electrically connect the ground terminal 4 and the vehicle body.

Figure 5:
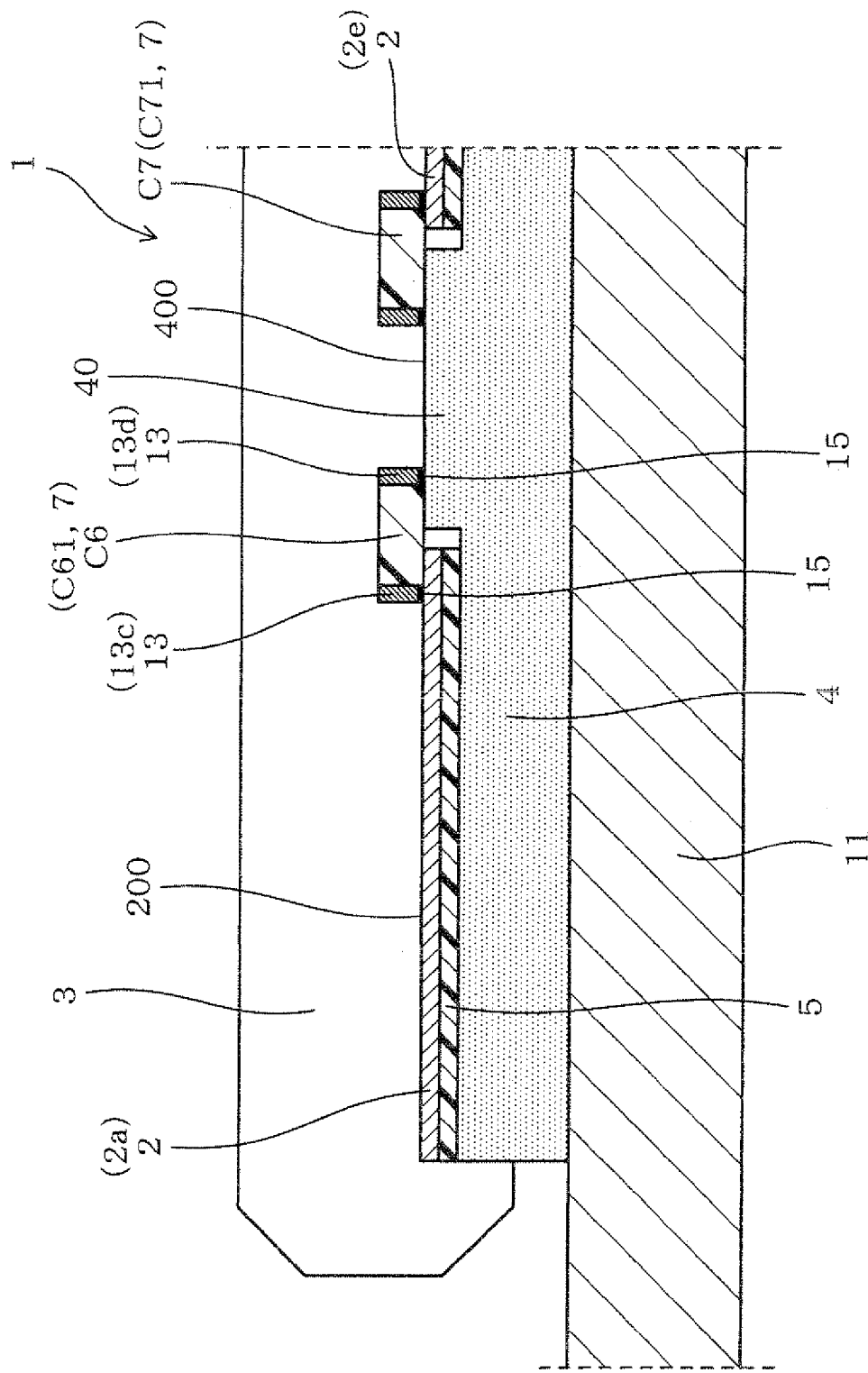
FIG. 5 is a sectional view taken along a C-C line in FIG. 2.

As shown in FIG. 2, in the present embodiment, the line bypass capacitors C6 and C7 (serving as part of the electronic components) are disposed between the switching elements Tr1 to Tr4 and the ground terminal 4. The line bypass capacitors C6 and C7 are mounted on the lead frames 2, respectively, as shown in FIG. 5.

In the present embodiment, a chip capacitor is used as the line bypass capacitor C6. As shown in FIG. 5, the ground terminal 4 has a protrusion 40 that protrudes inward the semiconductor module 1, where the protrusion has a primary surface 400. The primary surface 200 of the lead frames 2 has substantially the same level in height as the primary surface 400 of the protrusion 40. A line bypass capacitor C61 is arranged between the protrusion 40 and the lead frame 2a. The line bypass capacitor C61 has two connection terminals 13c and 13d. Of these connection terminals, one to connection terminal 13c is electrically connected on the primary surface of the first lead frame 2a by a soldering portion 15. The other connection terminal 13d is soldered on the primary surface of the protrusion 40. This connection is also true of the other line bypass capacitors C71, C62 and C72 shown in FIG. 2.

Figure 6:
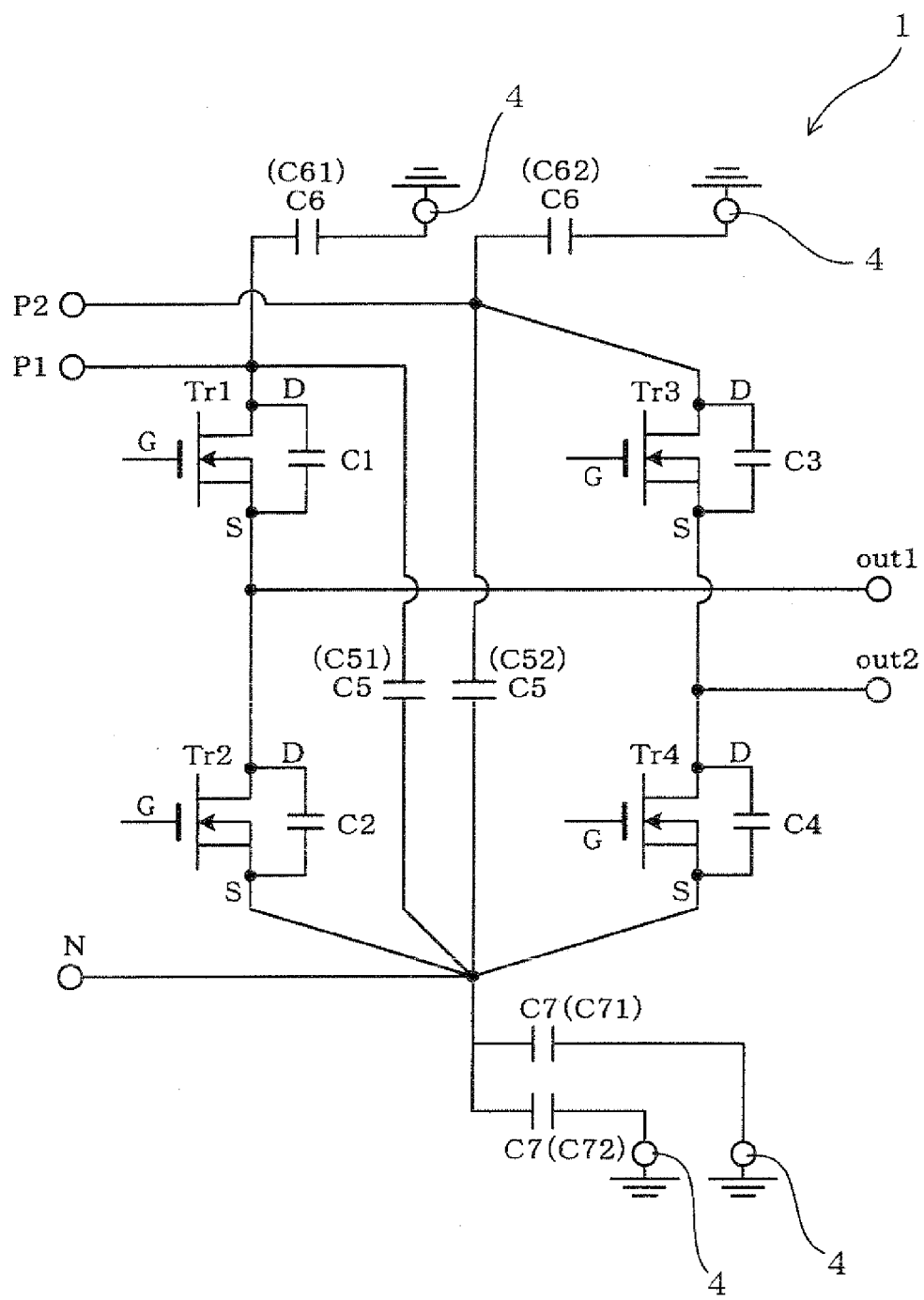
FIG. 6 is a circuit diagram showing the semiconductor module in the first embodiment.

Referring to FIG. 6, the circuit diagram of the semiconductor module 1 according to the present embodiment will now be described. As described above, in the present embodiment, the switching elements Tr1 to Tr4 are composed of the N-channel MOS transistor. The snubber capacitors C1 to C4 are connected between the source S and drain D of each of the switching elements Tr1 to Tr4, respectively. The semiconductor module 1 of the present embodiment has two positive-electrode terminals P1 and P2.

The semiconductor 1 is used in a state where the two positive-electrode terminals P1 and P2 are short circuited. These terminals P1 and P2 are electrically connected to the positive electrode of a DC power supply (not shown), while a negative-electrode terminal N is electrically connected to the negative electrode of the DC power supply. In addition, a snubber capacitor C5 is connected between the positive-electrode terminal P1 and the negative terminal N and between the positive-electrode terminal P2 and the negative terminal N. The snubber capacitor C5 has the same configuration as those of the snubber capacitors C1 to C4 shown in FIG. 2.

The switching elements Tr have gate terminals G electrically connected to a control circuit board (not shown). This control circuit board controls the operations of the switching elements Tr. The semiconductor module 1 in the present embodiment is used for, for example, a DC-DC converter.

Figure 7:
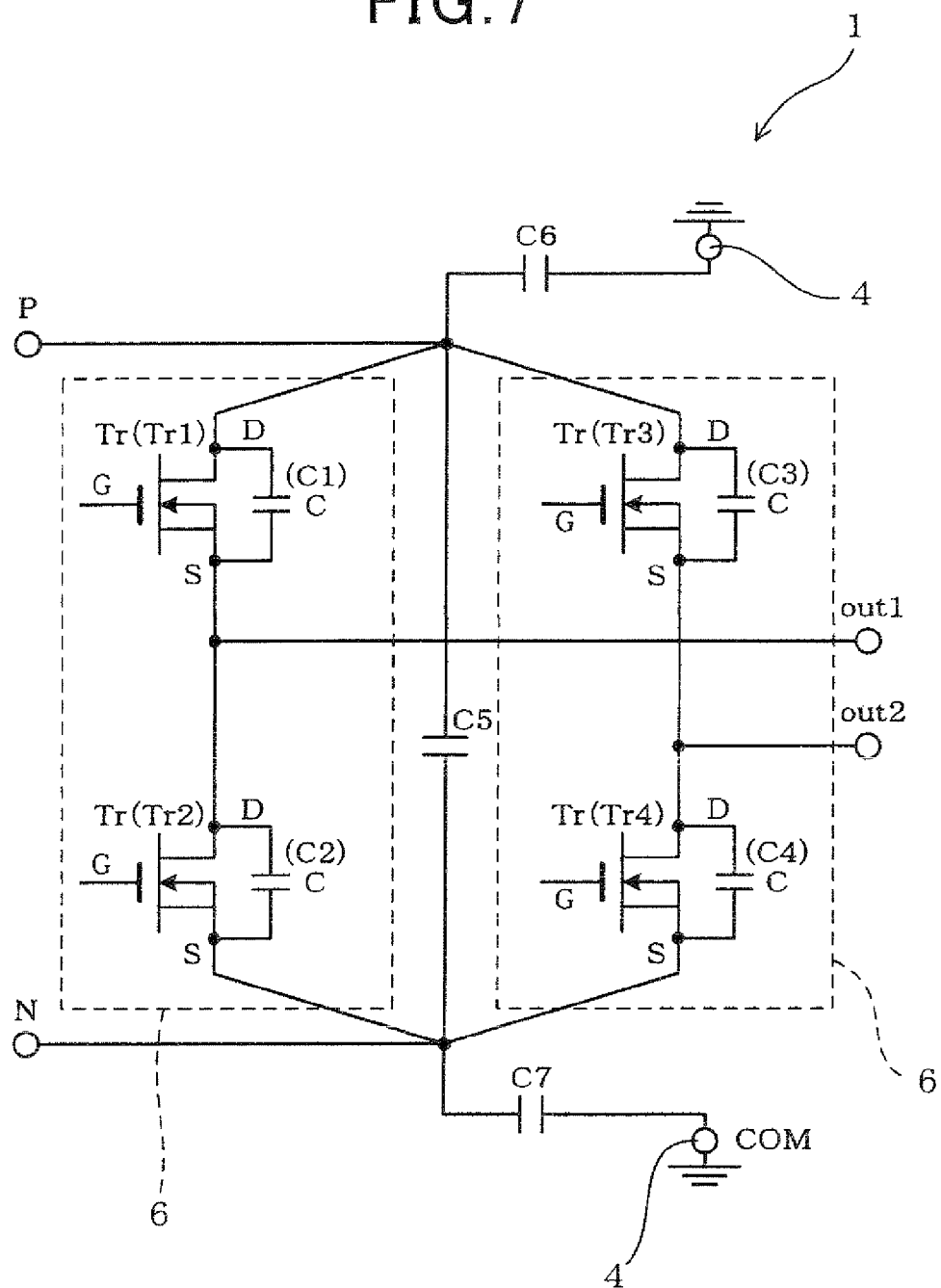
FIG. 7 shows an equivalent circuit of the circuit diagram shown in FIG. 6.

The circuit shown in FIG. 6 has an equivalent circuit shown in FIG. 7. As shown, the semiconductor module 1 has two (two-unit) switching element groups 6 connected parallel with each other, which are unified, where each (unit) switching element 6 has the two switching elements Tr connected in series and the snubber capacitors C connected in parallel with the respective switching elements Tr.

The operations and advantages in the present embodiment will now be described. As shown in FIGS. 2 and 3, the electronic components electrically connected to the switching elements Tr are mounted on the primary surfaces 200 of the lead frames 2. Hence, the inductance of connecting portion 15 each connecting the electronic components and the lead frame 2 can be made smaller. If the electronic components are connected using wire boding, it is likely that the wire has parasitic inductance. However, no wire is used in the present embodiment, and the electronic components are directly mounted on the primary surfaces 200 of the lead frames 2, whereby the inductance L can be made smaller. This makes it possible to lower the surge (V=−L·di/dt) caused by switching elements Tr.

In addition, in the present embodiment, of the paired connection terminals 13a and 13b of the electronic component which is the snubber capacitor C1, the one connection terminal 13a and the switching element Tr1 are arrange on the same lead frame 2a. The other electronic components (i.e., the snubber capacitors C2 to C5 and the line bypass capacitors C61 and C62) also have the same configuration as the above.

In this way, the switching elements Tr and the electronic components are arranged on the same lead frames 2, respectively. Thus, compared with a configuration where electronic components are mounted on the respective lead frames and wires are used to connect them, the inductance between the switching elements Tr and the electronic components can be further lowered. The surge caused in switching the switching elements Tr can be suppressed reliably.

Furthermore, in the present embodiment, as shown in FIGS. 2 and 3, the electronic component (i.e., the snubber capacitor C1) is electrically connected between the two lead frames 2a and 2b. One of the connection terminals, i.e., the connection terminal 13a, of the electronic component (the snubber capacitor C1) is arranged on one of the lead frames, i.e., the lead frame 2a, and the other connection terminal 13b is arranged on the other lead frame 2b.

By this arrangement, on the primary surface 200 of the lead frame 2a, the connection terminal 13a of the electronic component (the snubber capacitor C1) is made to be arranged. Hence, the inductance between the lead frame 2a and the electronic component can be lowered. Meanwhile, on the primary surface 200 of the other lead frame 2b, the other connection terminal 13b of the electronic component (the snubber capacitor C1) is made to be arranged. Hence, this makes it possible to lower the inductance between the lead frame 2b and the electronic component. As a result, the inductance between the two lead frames 2a and 2b can be lowered, thereby further lowering a surge when the switching element Tr1 is switched on and off.

Incidentally, the other electronic components (i.e., the snubber capacitors C2 to C5) have the same configuration set forth above, providing the same advantages.

Further, in the present embodiment, the snubber capacitors C1 to C5 and the line bypass capacitors C6 and C7 are mounted as the electronic components.

When the snubber capacitors C1 to C5 are employed as the electronic components, the snubber capacitors C1 to C5 can absorb surges even when the switching elements Tr is switched on and off. This means that it is possible to use switching elements Tr having lower withstand voltage, resulting in less cost in manufacturing the power conversion apparatus. Additionally, by mounting the snubber capacitors C1 to C5 on the primary surfaces 200 of the lead frames 2, the impedance between the lead frames 2 and the snubber capacitors C1 to C5 can be lowered. Hence, when the switching elements are switched on and off at higher speeds, current is easy to flow through the snubber currents C1 to C5, making the switching softer and lowering the switching loss of the switching elements Tr.

Additionally the line bypass capacitors C6 and C7 are employed as the electronic components, it is possible to reduce common mode noise leaking outside from the ground terminal via the stray capacitance of the semiconductor module 1. Further, by incorporating the line bypass capacitors C6 and C7 in the semiconductor module 1, the electronic circuit of the semiconductor module 1 can be made more compact in comparison with a configuration where those capacitors are arranged as separated components. Productivity of the semiconductor module 1 can thus be raised. Furthermore, the capacitors C6 and C7, which absorb the common mode noise, are positioned close to the switching elements Tr, which also acts as noise generating sources. This makes it possible to reduce a loop area through which common mode noise current flows, reducing radiation of electromagnetic waves.

Figure 4:
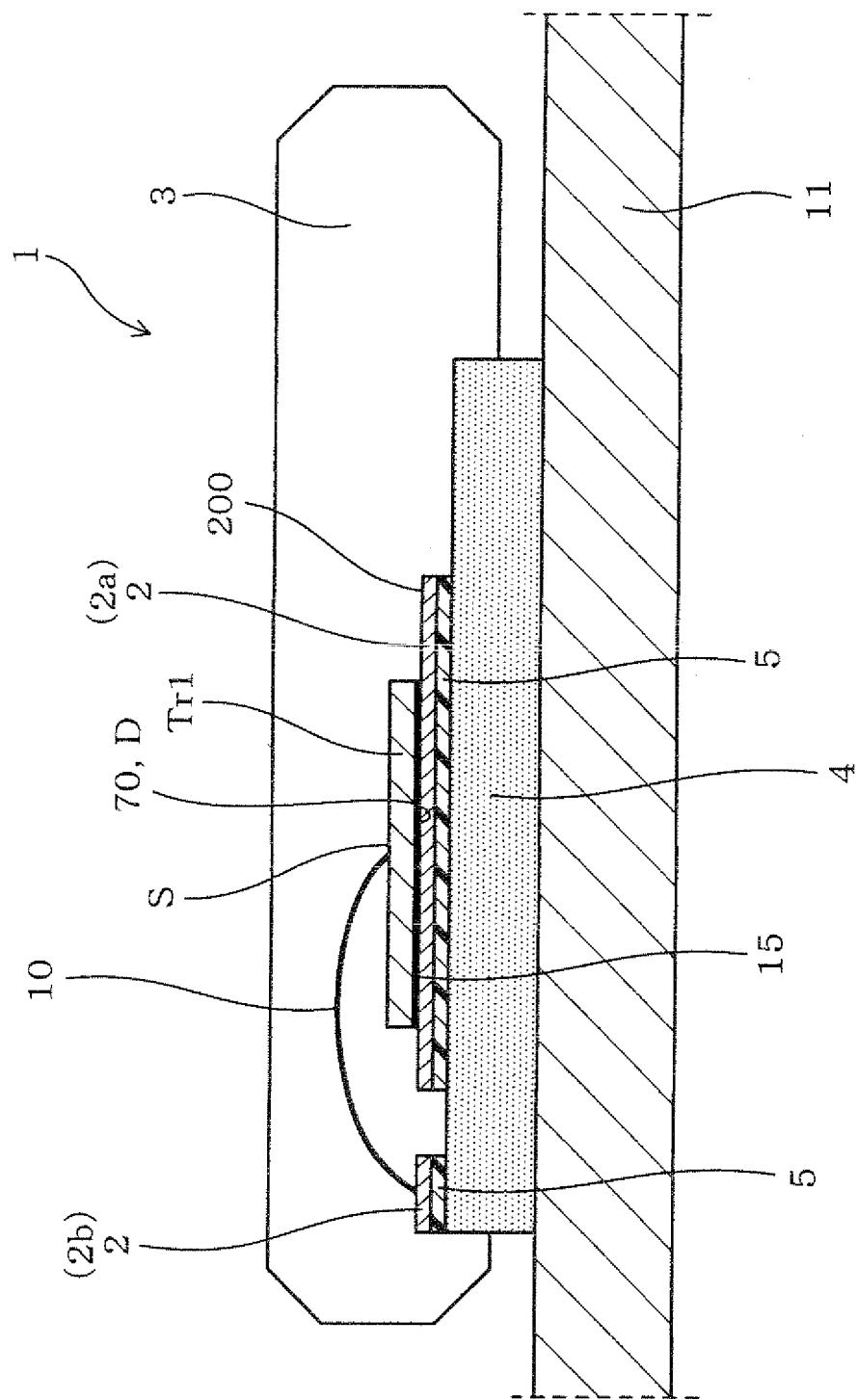
FIG. 4 is a sectional view taken along a B-B line in FIG. 2.

As shown in FIGS. 3 to 5, the snubber capacitors C1 to C5 and the line bypass capacitors C6 and C7 are composed of chip capacitors. The connection terminals 13 of these chip capacitors are soldered on the primary surfaces 200 of the lead frames 2.

This allows the inductance between the snubber capacitors C1 to C5 and the connection portions of the lead frames 2 to be lowered more. That is, if capacitors having lead wires are employed as the snubber capacitor C1 to C5, the lead wires are likely to have larger amounts of parasitic inductance L. Hence, the surge (V=−L·di/dt) and the switching loss tends to be larger. However, the chip capacitors are used as the foregoing capacitors C1 to C7 and connected by soldering, making it possible to connect the capacitors C1 to C7 to the lead frames 2 without using lead wires. Hence, the parasitic inductance between the capacitors C1 to C7 and the lead frames 2 stands against being larger, easily lowering both surges caused in operating the switching elements Tr and switching loss thereof.

Incidentally the connection terminals 13 of the chip capacitors and the primary surfaces 200 of the lead frames 2 are bonded by weld or electrically-conductive adhesive, providing the same advantages as described above.

As shown in FIG. 7, the semiconductor module 1 according to the present embodiment is composed by using the united switching element groups 6 each having two (two units) switching elements.

In this way, a plurality of switching element groups 6 are united, so that an electronic circuit can be produced with a fewer number of semiconductor modules in an easier manner, compared with production in which the switching elements Tr are sealed one by one. Accordingly, the electronic circuit can be made compact further in size and productivity can be raised.

In addition, as shown in FIG. 7, the semiconductor module 1 is configured by preparing a plurality of units of switching element groups 6 and connecting those groups mutually parallely.

Hence, the semiconductor module 1 can be used to more easily produce an electronic circuit. For example, when two switching element groups 6, each shown in FIG. 7, are connected parallel with each other and united as a semiconductor module 1, this module can be a DC-DC converter.

By way of example, three or more switching element groups 6 may be unified by connecting the groups parallely with each other. In the case of employing the three switching element groups 6 connected mutually parallely, the semiconductor module 1 can be used as an inverter.

As described, the present embodiment is able to provide the semiconductor module 1 capable of lowering surges caused in operating the switching elements Tr1 to Tr4.

Second Embodiment

Figure 8:
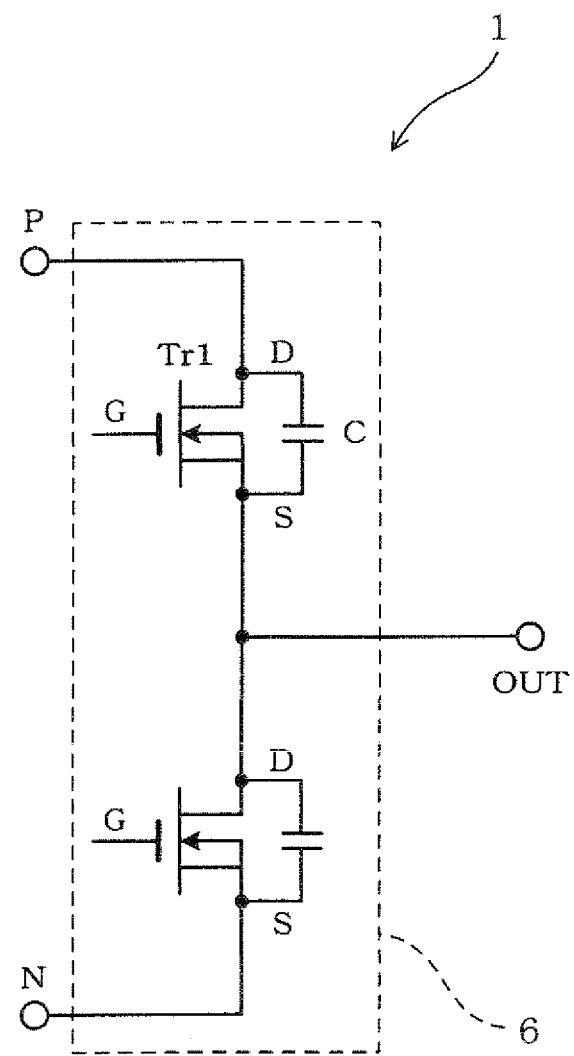
FIG. 8 is a circuit diagram showing a semiconductor module exemplified in a second embodiment of the present invention.

Referring to FIG. 8, a semiconductor module according to a second embodiment of the present invention will now be described.

In the second embodiment and subsequent embodiments, the same or identical components as or to those employed in the first embodiment, the same reference numerals are given for the sake of a simplified or omitted explanation.

The present embodiment provides an example in which the number of switching element groups 6 incorporated in the single semiconductor module 1 is changed from the foregoing one. As shown in FIG. 8, the embodiment shows that only one switching element group 6 is sealed for modularization.

This embodiment is thus preferable to an electronic circuit which requires only a single switching element group 6. In comparison with the foregoing configuration in which the plural switching element groups 6 are united, the electronic circuit can be produced with less cost, because only one switching element group 6 is needed.

In addition, the identical advantages to those in the first embodiment can be obtained.

Third Embodiment

Figure 9:
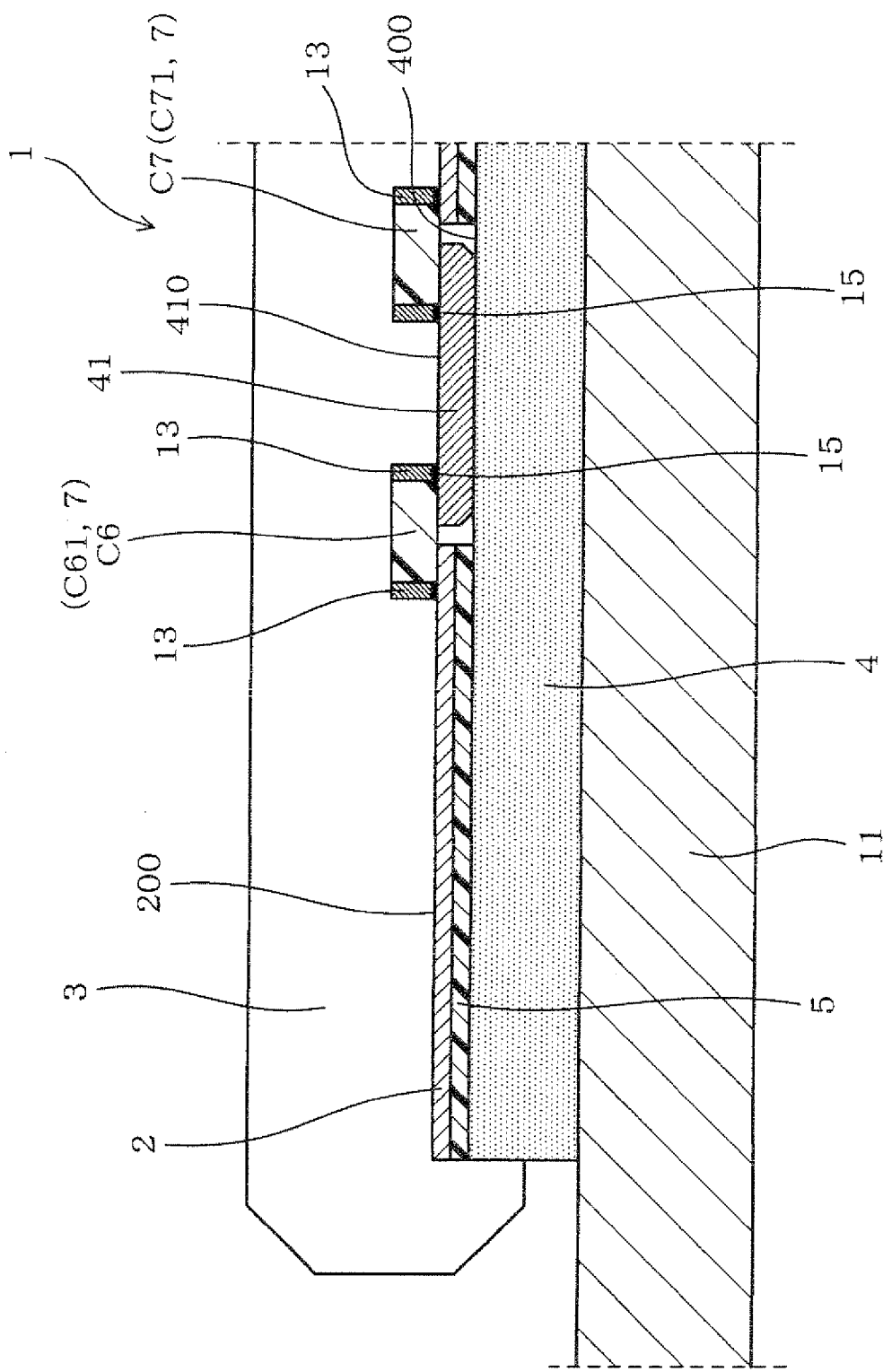
FIG. 9 is a circuit diagram showing a semiconductor module exemplified in a third embodiment of the present invention.

Referring to FIG. 9, a semiconductor module according to a third embodiment of the present invention will now be described.

The present embodiment provides an example in which the line bypass capacitors C6 and C7 are connected to the ground terminal 4 in another way. As shown in FIG. 9, the ground terminal 4 has no protrusion which is different from the protrusion 40 shown in FIG. 5, and is flat. The ground terminal 4 has the primary surface 400 on which a metal block 41 with a primary surface 410 is mounted and soldered or welded. The primary surfaces 200 of the lead frames 2 are approximately equal in level to the primary surface 410 of the metal block 41. The line bypass capacitors C6 and C7 are mounted to bridge over each of the lead frames 2 and the metal block 41, and soldered and welded.

The remaining configurations are identical to those described in the first embodiment.

The advantages of the present invention are as follows. The ground terminal 4 is not needed to have protrusions, which are seen in FIG. 5, so that the flat ground terminal 4 can be used Hence, the processing steps of the ground terminal 4 can be simplified, reducing manufacturing cost of the semiconductor module 1.

The present embodiment can also enjoy the similar or identical advantages to those in the first embodiment.

Fourth Embodiment

Figure 10:
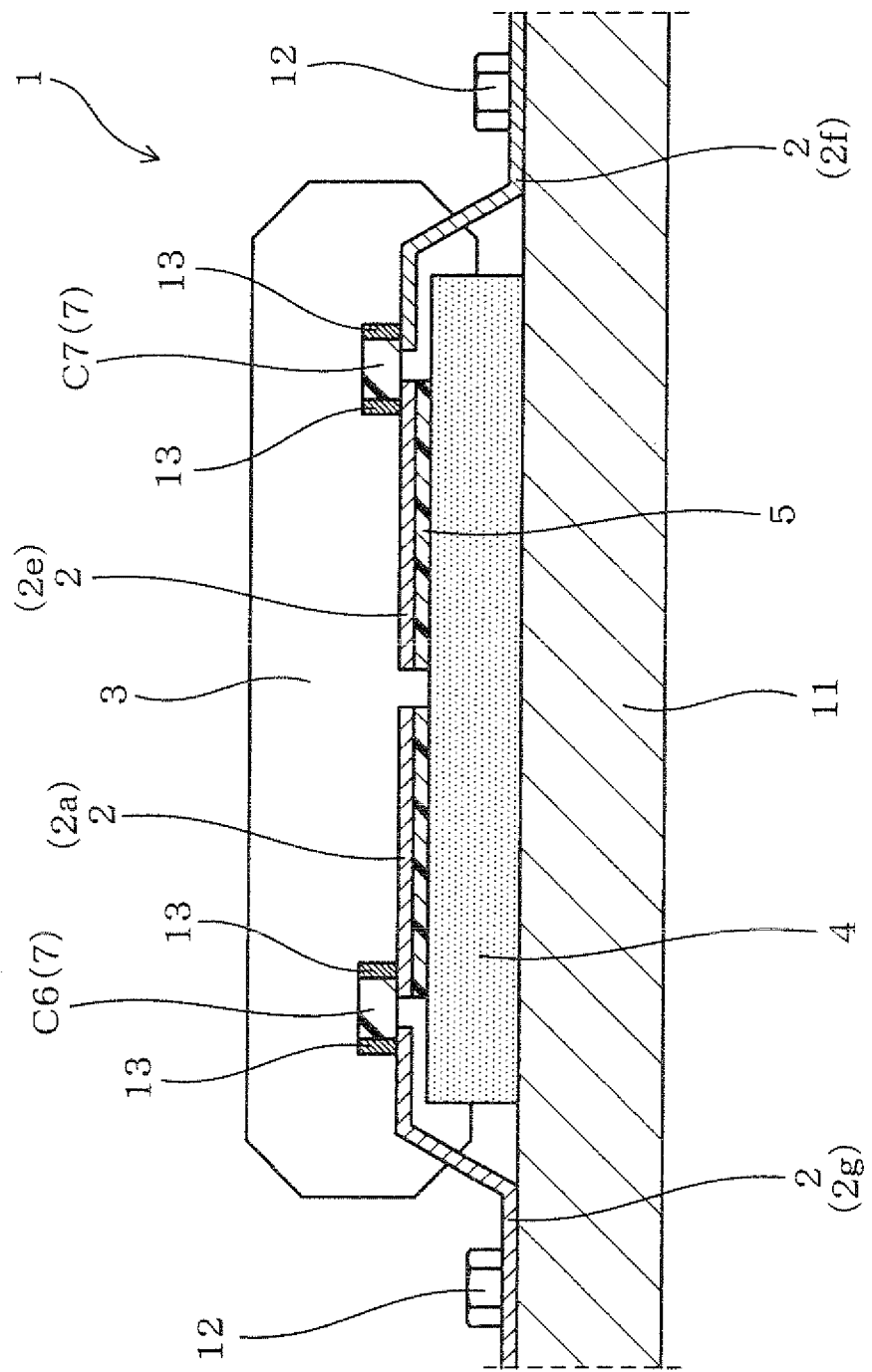
FIG. 10 is a circuit diagram showing a semiconductor module exemplified in a fourth embodiment of the present invention.

Referring to FIG. 10, a semiconductor module according to a fourth embodiment of the present invention will now be described.

The present embodiment provides an example in which the line bypass capacitors C6 and C7 are connected to the ground terminal 4 in another way. As shown in FIG. 10, the semiconductor module 1 has tightening lead frames 2f and 2g. Bolts 12 are inserted through the tightening lead frames 2f and 2g for being screwed with the mounting case 11, whereby the semiconductor module 1 is fixedly mounted to the case 11. Additionally the line bypass capacitor C6 is arranged between the first lead frame 2a and the tightening lead frame 2g, and soldered and welded. This arrangement is true of the other line bypass capacitor C7.

The remaining configurations are identical or similar to those in the first embodiment.

The present embodiment can provide the following advantage. The tightening lead frames 2f and 2g can be used to electrically connect the line bypass capacitors C6 and C7 to the ground terminal 4. This eliminates the necessity of forming protrusions at the ground terminal 4, which are seen as the protrusions 40 in FIG. 5, and of arranging a metal block, which is seen as the metal block 41 in FIG. 9. Hence, the semiconductor module 1 can be produced at lower cost.

Of course, the present embodiment can provide the identical to similar advantages to those set forth in the first embodiment.

Fifth Embodiment

Figure 11:
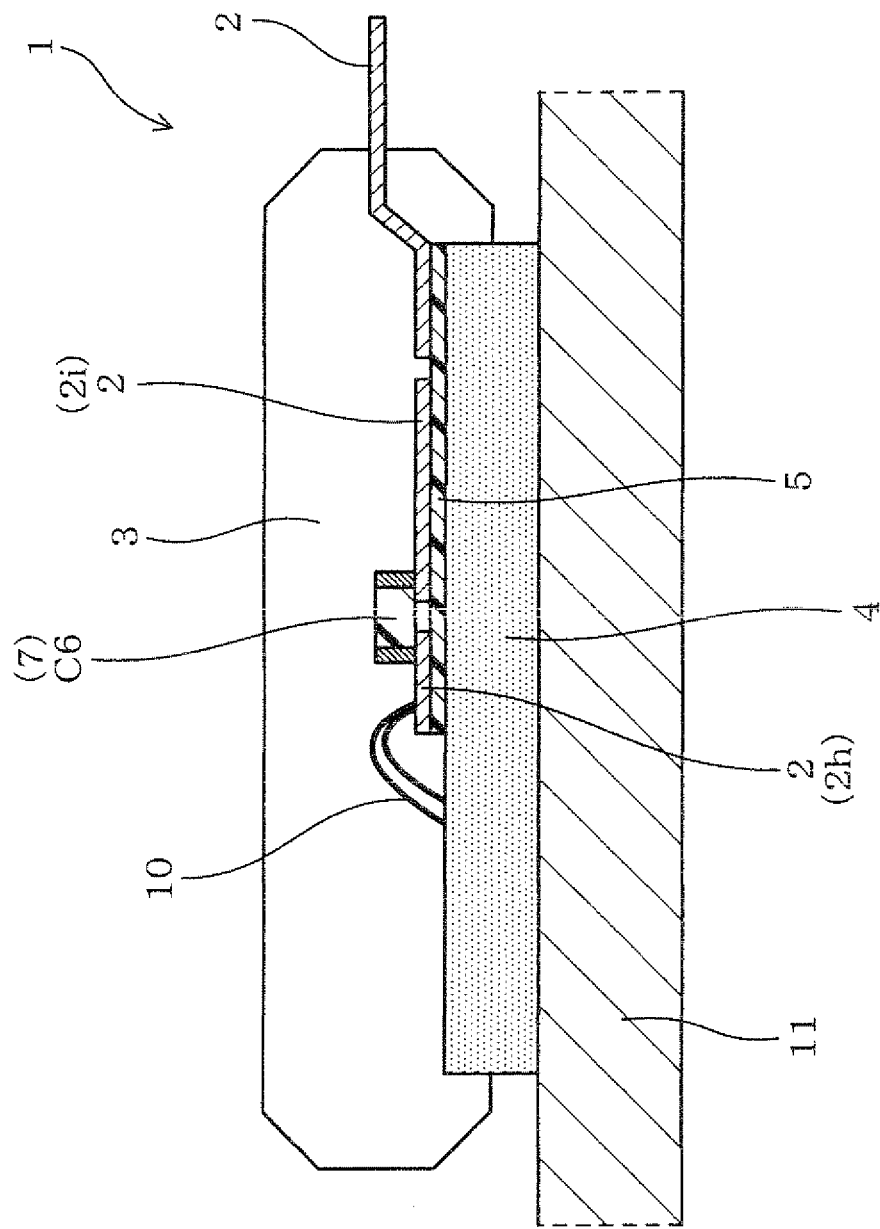
FIG. 11 is a circuit diagram showing a semiconductor module exemplified in a fifth embodiment of the present invention.

Referring to FIG. 11, a semiconductor module according to a fifth embodiment of the present invention will now be described.

The present embodiment relates to an embodiment in which the line bypass capacitor C6 is connected to the connection terminal 4 in a different manner. As shown in FIG. 11, the line bypass capacitor C6 is arranged between two lead frames 2h and 2i, and soldered or welded. The lead frame 2h is bonded to the ground terminal 4 using wires 10. This connection technique is also true of the other line bypass capacitor C7 (refer to FIG. 2).

The remaining configurations are identical or similar to those in the first embodiment.

An advantage can be obtained as follows. Using a wire bonding step for the switching elements Tr1 to Tr4, the line bypass capacitors C6 and C7 can be connected to the ground terminal 4. Thus the semiconductor module 1 can be produced at lower cost.

Other advantages in the present embodiment are the same at those in the first embodiment.

Sixth Embodiment

Figure 12:
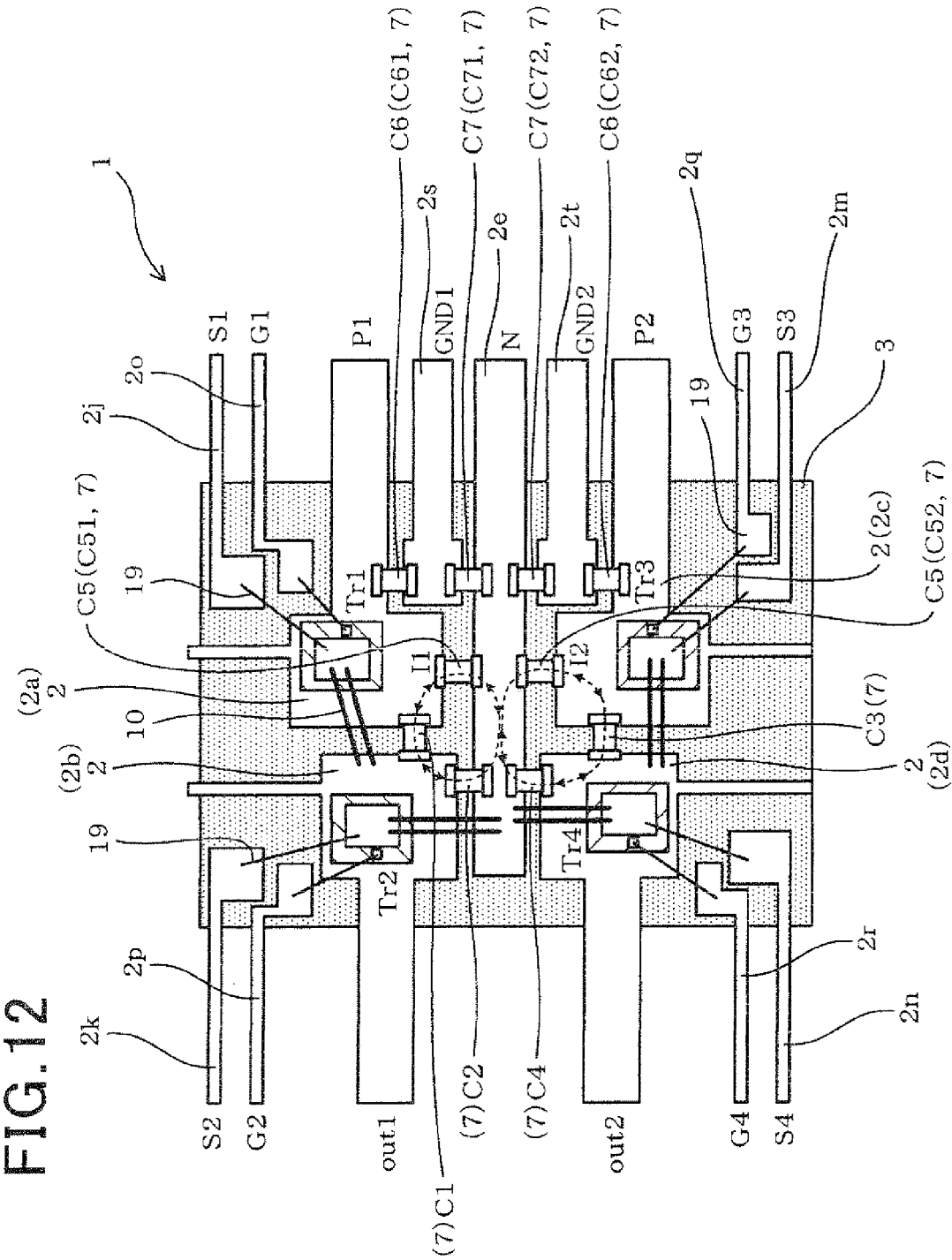
FIG. 12 is a circuit diagram showing a semiconductor module exemplified in a sixth embodiment of the present invention.

Referring to FIG. 12, a semiconductor module according to a sixth embodiment of the present invention will now be described.

The present embodiment relates to another example in which the switching elements Tr are arraigned at different positions described in the foregoing. As shown in FIG. 12, in same manner as the first embodiment, the semiconductor module of this embodiment has four switching elements Tr1 to Tr4. When viewing the semiconductor module along a normal line to the primary surfaces 200 of the lead frames 2 (a direction orthogonal to the plane of the paper), the four switching elements Tr1 to Tr4 are located at positions virtually corresponding the apexes of a quadrangle, respectively.

The electronic circuit of the semiconductor module 1 according to the present embodiment are identical to that shown in FIG. 6. In the same way as that in the first embodiment, the semiconductor module 1 has the plural lead frames 2, the four switching elements Tr, and the electronic components (including the snubber capacitors C1 to C5 and the line bypass capacitors C6 and C7).

The switching elements Tr1 to Tr4 are mounted on the lead frames 2a to 2d respectively. The first switching element Tr1 is mounted on the first lead frame 2a which functions as a first positive-electrode terminal P1, the third switching element Tr3 is mounted on the third lead frame 2c which functions as a second positive-electrode terminal P2. Similarly, the second switching element Tr2 is mounted on the second lead frame 2b which functions as a first output terminal OUT1, and the fourth switching element Tr4 is mounted on a fourth lead frame 2d which functions as a second output terminal OUT2.

The semiconductor module 1 has additional lead frames 2j to 2r for signal input. Of these lead frames, the lead frames 2j, 2k, 2m and 2n are electrically connected to the source electrodes (S1 to S4) of the switching elements Tr respectively via signal wires 19. Meanwhile the lead frames 2o, 2p, 2q and 2r are also electrically connected to the gate electrodes (G1 to G4) of the switching elements Tr respectively via further signal wires 19.

The semiconductor module 1 also has a pair of ground lead frames 2s and 2t and a fifth lead frame 2e which functions as a negative-electrode terminal N. The fifth lead frame 2e is positioned between the first lead frame 2a and the third lead frame 2c and is also positioned between the second lead frame 2b and the fourth lead frame 2d. The first ground lead frame 2s is positioned between the first lead frame 2a and the fifth lead frame 2e. The second ground lead frame 2t is positioned between the third lead frame 2c and the fifth lead frame 2e.

Of the plural lead frames 2, the first lead frame 2a, the third lead frame 2c, the fifth lead frame 2e, the ground lead frames 2s and 2t, and the signal-input lead frames 2j, 2m, 2o and 2q all are protruded from the sealing member 3 in the same one direction.

Additionally, of the plural lead frames 2, the second lead frame 2b, the fourth lead frame 2d, and the signal-input lead frames 2k, 2p, 2r and 2n all are protruded from the sealing member in an opposite direction to that along which the foregoing lead frames including the first lead frame 2a are protruded.

As shown in FIG. 12, the first snubber capacitor C1 is arranged between the first and second lead frames 2a and 2b. The third snubber capacitor C3 is arranged between the third and forth lead frames 2c and 2d. Further the snubber capacitors C2, C4, C51 and C52 are arranged between the first to fourth lead frames 2a to 2d and the fifth lead frame 5e, respectively.

The line bypass capacitor C61 is arranged between the first lead frame 2a and the first ground lead frame 2s, while the third line bypass capacitor C71 is arranged between the fifth lead frame 2e and the first ground lead frame 2s. The fourth line bypass capacitor C72 is arranged between the fifth lead frame 2e and the second lead frame 2t, and the second line bypass capacitor C62 is arranged between the third lead frame 2c and the second ground lead frame 2t.

The remaining configurations are identical or similar to those in the first embodiment.

Advantages obtained in the present embodiment are below.

The four switching elements Tr1 to Tr4 are located at positions virtually corresponding to the four apexes of a quadrangle, respectively. Thus the four switching elements Tr can be located close to each other, reducing the inductance between the four switching elements Tr1 to Tr4. In addition, compared with an arrangement where the four switching elements Tr are lined up straight (refer to FIG. 2), the semiconductor module 1 can be made more compact, being smaller in size.

Furthermore, the first, second, and fifth lead frames 2a, 2b and 2e can be located close to each other. This makes it possible to locate the snubber capacitors C1, C2 and C51, each of which connects two of the lead frames 2a, 2b and 2e, close to each other. Hence, amounts of electromagnetic waves emitted from a noise current I1 can be reduced. In other words, when the switching elements Tr1, Tr2 are switched on and off, parasitic inductance existing around the switching elements Tr1 and Tr2 may cause the noise current I1. This noise current I1 flows through a path passing the snubber capacitors C1, C2 and C51. In the present embodiment, the snubber capacitors C1, C2 and C51 are located close to each other, so that the area delineated by a loop along which the noise current I1 flows (i.e. a loop area) can be made smaller. It is therefore possible to reduce the radiation amount of the electromagnetic waves from the noise current I1.

Similarly, the third, fourth and fifth lead frames 2c, 2d and 2e can be arranged close to each other, so that the snubber capacitors C3, C4 and C52 can be located close to each other which are connected between the lead frames 2c, 2d and 2e respectively. When the switching elements Tr3 and Tr4 are switched on and off, noise current I2 occurs, and flows through a path passing the snubber capacitors C3, C4 and C52. However, the snubber capacitors C3, C4 and C52 are located close to each other, so that the area delineated by a loop along which the noise current I2 flows (i.e. a loop area) can be made smaller. It is therefore possible to reduce the radiation amount of the electromagnetic waves from the noise current I2.

Besides the above, the advantages identical or similar to those in the first embodiment can be provided in the present embodiment.

Seventh Embodiment

Figure 13:
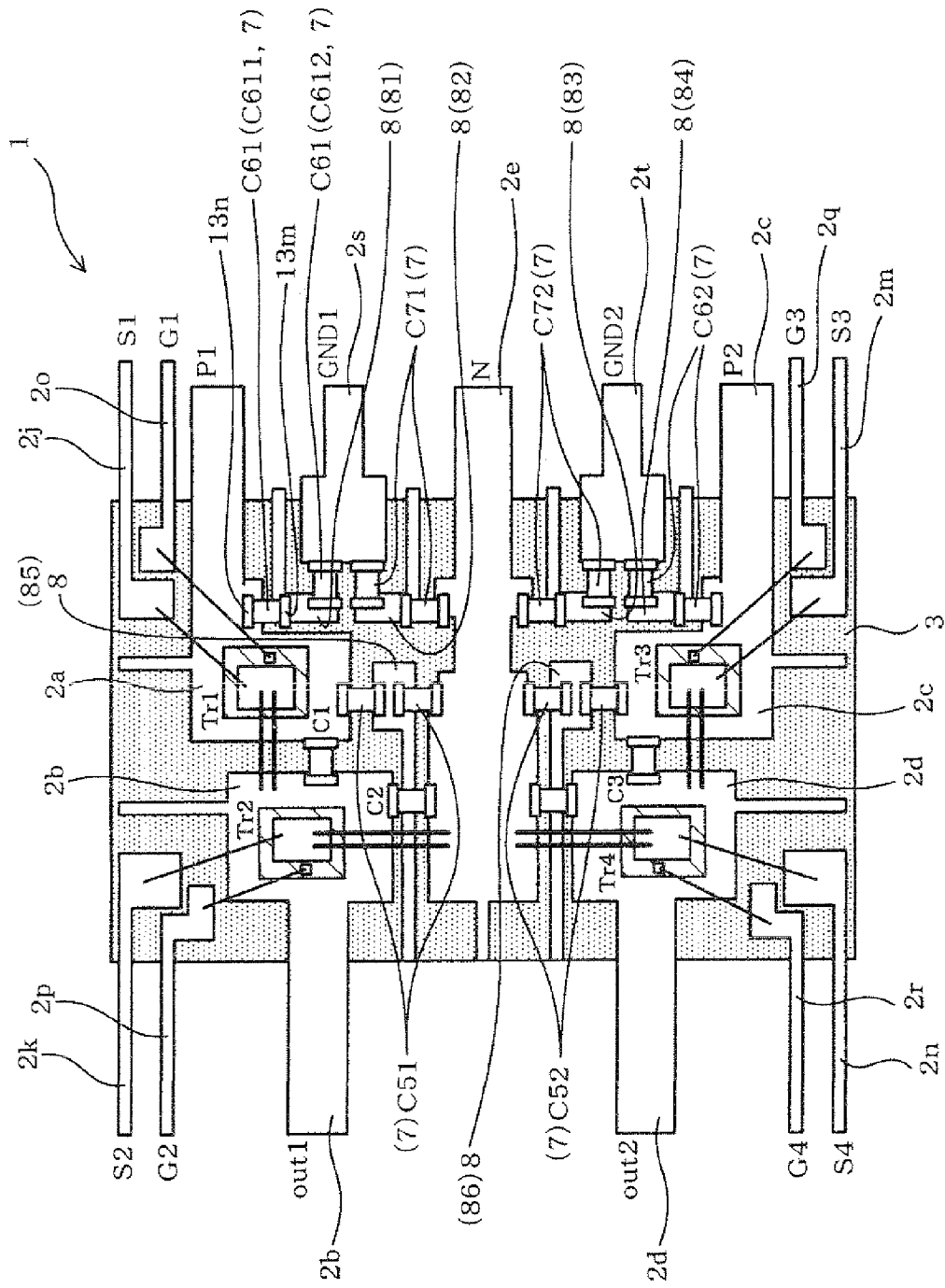
FIG. 13 is a circuit diagram showing a semiconductor module exemplified in a seventh embodiment of the present invention.

Referring to FIG. 13, a semiconductor module according to a seventh embodiment of the present invention will now be described.

In the present embodiment, the number of snubber capacitors and line bypass capacitors is changed from those of the foregoing embodiments. As shown in FIG. 13, the semiconductor module 1 has snubber capacitors C51 and C52 and line bypass capacitors C61, C62 and C71 and C72, which are two in number respectively. The semiconductor module 1 has a plurality of relaying lead frames 8 which are separated from the lead frames 2 respectively, and these relaying lead frames 8 are used to connect in series the two line bypass capacitors C61 etc.

The relaying lead frames 8 are produced as metal plates which are the same in type as that composing the lead frames 2. In the present embodiment, the relaying lead frames 8 are six in number, which consist of the first to sixth relaying lead frames 81 to 86. The first relaying lead frame 81 is located between the first ground lead frames 2s and the first lead frame 2a. Similarly, the second relaying lead frame 82 is located between the first ground lead frame 2s and the fifth lead frame 2e; the third relaying lead frame 83 is located between the second ground lead frame 2t and the fifth lead frame 2e; the fourth relaying lead frame 84 is located between the second ground lead frame 2t and the third lead frame 2c; the relaying fifth lead frame 85 is located between the first lead frame 2a and the fifth lead frame 2e; and the relaying sixth lead frame 86 is located between the third lead frame 2c and the fifth lead frame 2e.

In the present embodiment, the first relaying lead frames 81 is used to connect in series the first line bypass capacitors C61 which are two in number. The two first line bypass capacitors C61 and the first relaying lead frame 81 realize an electrical connection between the first lead frame 2a and the first ground lead frame 2s. This electrical connection is also realized for each of the other line bypass capacitors C62, C71 and C72 and the snubber capacitors C51 and C52.

In addition, of the two first line bypass capacitors C61, the one capacitor C611 is electrically connected between the first lead frame 2a and the first relaying lead frame 81. The line bypass capacitor C611 has a pair of connection terminals 13m and 13n and, of these connection terminals, the one connection terminal 13m is arranged on the primary surface of the first relaying lead frame 81 and the other connection terminal 13n is arranged on the primary surface 200 of the first lead frame 2a. This arrangement is true of the other capacitor C612 of the first line bypass capacitors. The line bypass capacitors C62, C71, C72 and the snubber capacitors C51 and C52 are structured in the same manner as the above.

The remaining configurations are identical or similar to those of the sixth embodiment.

Advantages of the present embodiment are as follows. One of the connection terminals of the electronic component (the line bypass capacitor C611), 13m, is arranged on the primary surface of the first relaying lead frame 81. Thus inductance between the first relaying lead frame 81 and the line bypass capacitor C611 can be reduced. Similarly, on the primary surface 200 of the first lead frame 2a, the other connection terminal 13n of the electronic component (the line bypass capacitor C612) is arranged. Inductance between the first lead frame 2a and the line bypass capacitor C611 can be reduced. As a result, inductance between the first lead frame 2a and the first relying lead frame 81 can also be reduced.

As to the other electronic components (i.e., the line bypass capacitors C612, C62, C71, C72 and the snubber capacitors C51, C52) which have the same structures, the foregoing advantage is given.

Additionally, the plural line bypass capacitors C611 and C612 are electrically connected in series via the first relaying lead frame 81. The lead frames 2a and 2s, which are located separately from each other, are electrically connected by the plural line bypass capacitors C611 and C612 and the first relaying lead frame.

In this way, the plural line bypass capacitors C611 and C612 are directly connected with each other. Hence, when one of the line bypass capacitors C611 and C612 is short-circuited, the normal operation can be maintained unless the other of those capacitors causes a malfunction. This will raise reliability of the semiconductor module 1 with respect to its operations.

Furthermore, the plural line bypass capacitors C611 and C612 and the first relaying lead frame 81 connect electrically the two lead frames 2a and 2s, without using wires or leads. Inductance between the two lead frames 2a and 2s can thus be lowered.

This structure is also applied to the other electronic components (the line bypass capacitors C62, C71, C72 and the snubber capacitors C51, C52), providing the same advantage.

The remaining advantages obtained by this embodiment are identical or similar to those in the sixth embodiment.

Eighth Embodiment

Figure 14:
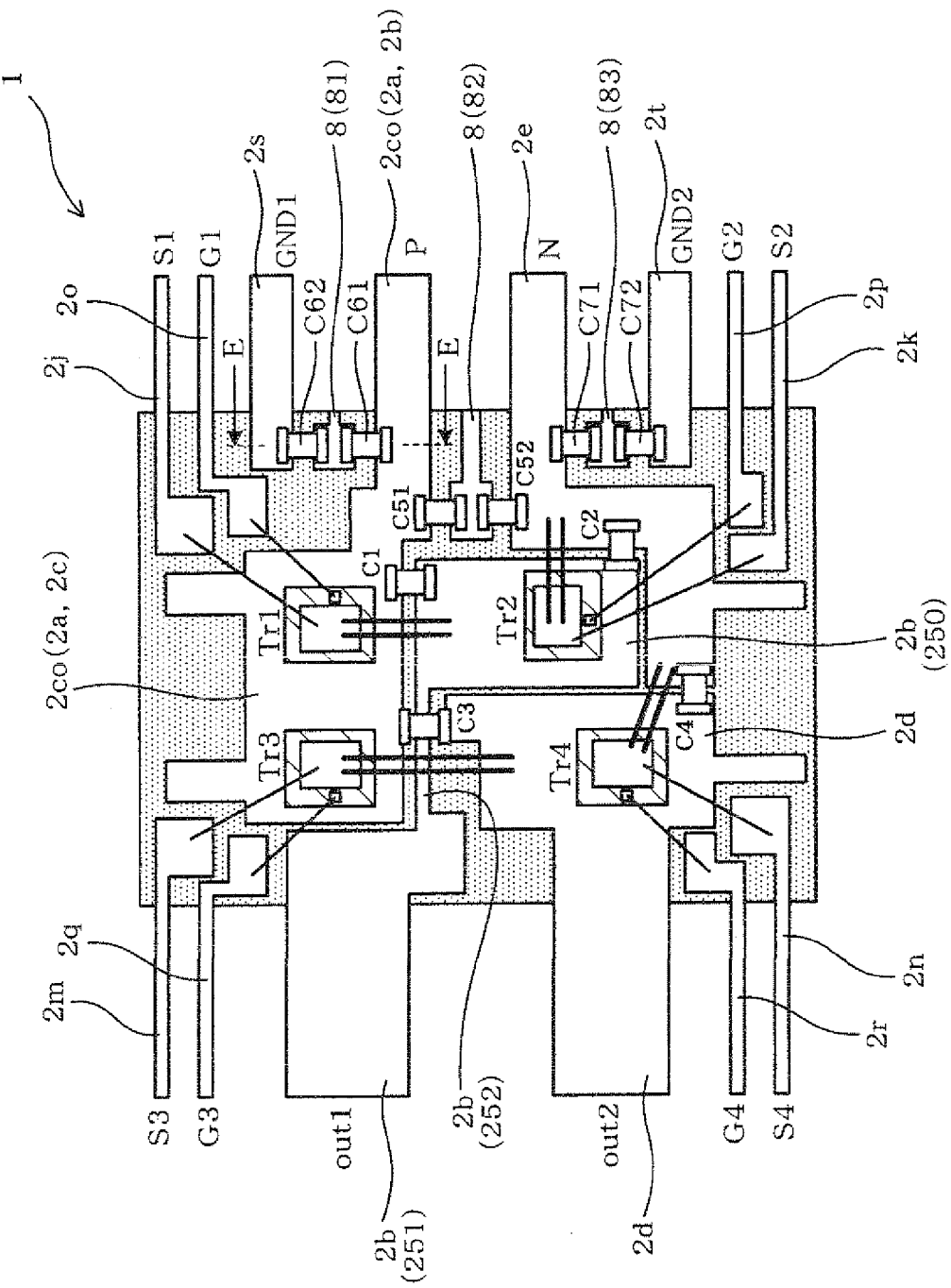
FIG. 14 is a circuit diagram showing a semiconductor module exemplified in an eighth embodiment of the present invention.
Figure 15:
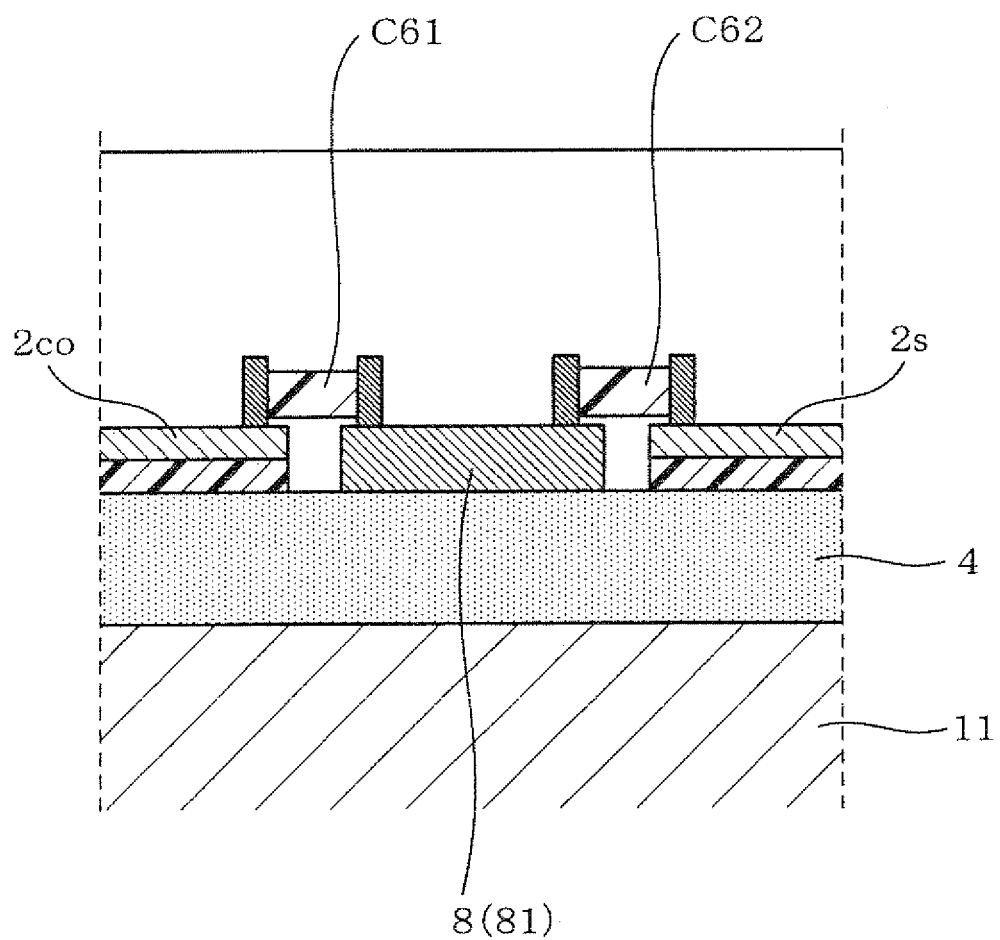
FIG. 15 is a sectional view taken along an E-E line in FIG. 14.

Referring to FIGS. 13 to 15, a semiconductor module according to an eighth embodiment of the present invention will now be described.

The present embodiment relates to a modification of the lead frames 2. As shown in FIG. 14, the present embodiment provides the semiconductor module 1 provided with a common lead frame 2co formed by integrating the first lead frame 2a and the third lead frame 2c. This common lead frame 2co is able to consolidate the two positive-electrode terminals P1 and P2 in the sixth and seventh embodiments (refer to FIGS. 13 and 14).

Additionally, the second lead frame 2b has a mounting member 250, a terminal portion 251, and a link portion 252 linking the mount portion 250 and the terminal 251. The terminal portion 251 functions as a first output terminal OUT1 of the semiconductor module 1. The link portion 252 is located between the common lead frame 2co and the fourth frame 2d. The snubber capacitor C3 is arranged to be over the link portion 252 between the common lead frame 2co and the fourth lead frame 2d.

Additionally, the semiconductor module 1 has three relaying lead frames 8 consisting of first to third relaying lead frames 81 to 83. The first relaying lead frame 81 is located between the first ground lead frame 2s and the common lead frame 2co. Similarly to this, the second relaying lead frame 82 is located between the common lead frame 2co and the fifth lead frame 2e, and the third relaying lead frame 83 is located between the fifth lead frame 2e and the second ground lead frame 2t.

In the present embodiment, the first line bypass capacitor C61, the first relaying lead frame 81, and the second line bypass capacitor C62 realize an electrical connection between the first ground lead frame 2s and the common lead frame 2co. The identical connection to this is true of the other line bypass capacitors C71, C72 and the snubber capacitors C51, C52. The relaying lead frames 81, 82 and 83 are made of conductive adhesive, as shown in FIG. 15.

The other configurations are identical or similar to those in the sixth embodiment.

Advantages gained by the present embodiment are as follows.

Between the common lead frame 2co and the fourth lead frame 2d, the snubber capacitor C3 is placed to be over the link portion 252. This makes it possible to arrange the third snubber capacitor C3 between the lead frames 2co and 2d, with the link portion 252 still between those lead frames 2co and 2d. By adopting this structure with the link portion 252 located between the lead frames 2co and 2d, the mount portion 250 of the second lead frame 2b can be separated positionally from the terminal portion 251, raising a degree of freedom in designing the semiconductor module 1. Further, arranging the third snubber capacitor C3 allows this capacitor C3 to absorb surges caused by switching on and off the third switching element Tr3.

Furthermore, the relaying lead frames 81, 82 and 83 are formed using the conductive adhesive. Hence, this eliminates the necessity of forming protrusions, such as protrusions 40 (refer to FIG. 5), to connect the line bypass capacitor C61 and C62 to the ground terminal 4 respectively. The flat ground terminal 4 with less manufacturing cost can be used, lowering the cost in manufacturing the semiconductor module 1.

The present embodiment can also provide other advantages which are identical or similar to those in the sixth embodiment.

What is claimed is:

1. A semiconductor module comprising:
a plurality of lead frames;
switching elements electrically connected to the lead frames respectively;
electronic components electrically connected to the switching elements; and
a sealing member that seals at least part of the lead frames, the switching elements, and the electronic components, wherein
the electronic components are mounted on primary surfaces of the lead frames,
the electronic components have a pair of connection terminals,
the electronic components are connected between the two lead frames, and
the pair of connection terminals are arranged, terminal by terminal, on the primary surfaces of the lead frames, respectively, which are different from each other; and
the electronic components composed of a plurality of electronic components are connected in series via relaying lead frames and two lead frames of the lead frames are electrically connected by both the plurality of electronic components and the relaying lead frames, the two lead frames being positionally separated from each other.

2. The semiconductor module of claim 1, wherein
one of connection terminals composing the pair of connection terminals and a corresponding one of the switching elements are arranged on the same lead frame.

3. The semiconductor module of claim 1, wherein the electronic components are either snubber capacitors or line bypass capacitors, the snubber capacitors being electrically connected parally with the switching elements respectively to absorb surges caused when the switching elements are switched on and off, the line bypass capacitors being electrically connected between the switching elements and a ground terminal to absorb common mode noise caused when the switching elements are switched on and off.

4. The semiconductor module of claim 3, wherein each of the snubber capacitors and the line bypass capacitors is a chip capacitor having connection terminals bonded to corresponding ones of the primary surfaces of the lead frames by soldering, welding, or using conductive adhesive.

5. The semiconductor module of claim 4, wherein, of the switching elements, mutually serially connected two switching elements and, of the snubber capacitors, two snubber capacitors connected to the two switching elements respectively are grouped as one unit of switching element groups, wherein the one unit or plural units of the switching element groups are united for being sealed by the sealing member.

6. The semiconductor module of claim 5, wherein the plural units of the switching element groups are connected parally with each other and united with each other.

7. The semiconductor module of claim 6, wherein the switching element groups include two units of the switching element groups having four switching elements included in the switching elements, the four switching elements being located at positions virtually corresponding to apexes of a quadrangle when viewed along a line normal to the primary surfaces of the lead frames.

8. A semiconductor module comprising:
a plurality of lead frames;
switching elements electrically connected to the lead frames respectively;
electronic components electrically connected to the switching elements;
a sealing member that seals at least part of the lead frames, the switching elements, and the electronic components; and
relaying lead frames positionally separated from the lead frames, wherein
the electronic components are mounted on primary surfaces of the lead frames,
the electronic components have a pair of connection terminals, one terminal of the paired connection terminals is mounted on a corresponding one of primary surfaces of the relaying lead frames, and the other connection terminal is mounted on a corresponding one of the primary surfaces of the lead frames, and
the electronic components composed of a plurality of electronic components are connected in series via the relaying lead frames and two lead frames of the lead frames are electrically connected by both the plurality of electronic components and the relaying lead frames, the two lead frames being positionally separated from each other.

9. The semiconductor module of claim 8, wherein the electronic components are either snubber capacitors or line bypass capacitors, the snubber capacitors being electrically connected parally with the switching elements respectively to absorb surges caused when the switching elements are switched on and off, the line bypass capacitors being electrically connected between the switching elements and a ground terminal to absorb common mode noise caused when the switching elements are switched on and off.

10. The semiconductor module of claim 8, wherein, of the switching elements, mutually serially connected two switching elements and, of the snubber capacitors, two snubber capacitors connected to the two switching elements respectively are grouped as one unit of switching element groups, wherein the one unit or plural units of the switching element groups are united for being sealed by the sealing member.

11. The semiconductor module of claim 9, wherein each of the snubber capacitors and the line bypass capacitors is a chip capacitor having connection terminals bonded to corresponding ones of the primary surfaces of the lead frames by soldering, welding, or using conductive adhesive.

12. The semiconductor module of claim 11, wherein, of the switching elements, mutually serially connected two switching elements and, of the snubber capacitors, two snubber capacitors connected to the two switching elements respectively are grouped as one unit of switching element groups, wherein the one unit or plural units of the switching element groups are united for being sealed by the sealing member.

13. The semiconductor module of claim 12, wherein the plural units of the switching element groups are connected parally with each other and united with each other.

14. The semiconductor module of claim 13, wherein the switching element groups include two units of the switching element groups having four switching elements included in the switching elements, the four switching elements being located at positions virtually corresponding to apexes of a quadrangle when viewed along a line normal to the primary surfaces of the lead frames.

15. A semiconductor module comprising:
a plurality of lead frames;
switching elements electrically connected to the lead frames respectively;
electronic components electrically connected to the switching elements; and
a sealing member that seals at least part of the lead frames, the switching elements, and the electronic components,
wherein the electronic components are mounted on primary surfaces of the lead frames and the electronic components are either snubber capacitors or line bypass capacitors, the snubber capacitors being electrically connected parallely with the switching elements respectively to absorb surges caused when the switching elements are switched on and off, the line bypass capacitors being electrically connected between the switching elements and a ground terminal to absorb common mode noise caused when the switching elements are switched on and off.

* * * * *